United States Patent
Sriram et al.

(10) Patent No.: US 7,265,399 B2
(45) Date of Patent: Sep. 4, 2007

(54) ASYMETRIC LAYOUT STRUCTURES FOR TRANSISTORS AND METHODS OF FABRICATING THE SAME

(75) Inventors: Saptharishi Sriram, Cary, NC (US); Jason Henning, Carrboro, NC (US)

(73) Assignee: Cree, Inc., Durham, NC (US)

( * ) Notice: Subject to any disclaimer, the term of this patent is extended or adjusted under 35 U.S.C. 154(b) by 45 days.

(21) Appl. No.: 10/977,227

(22) Filed: Oct. 29, 2004

(65) Prior Publication Data

US 2006/0091498 A1 May 4, 2006

(51) Int. Cl.
*H01L 29/80* (2006.01)
*H01L 21/338* (2006.01)

(52) U.S. Cl. .................. 257/287; 257/401; 257/773; 438/179; 438/286

(58) Field of Classification Search ............. 257/280, 257/287, 343, 401, 773, 775; 438/167, 179, 438/286
See application file for complete search history.

(56) References Cited

U.S. PATENT DOCUMENTS

| | | | |
|---|---|---|---|
| 3,903,592 A | 9/1975 | Heckl | |
| 4,732,871 A | 3/1988 | Buchmann et al. | |
| 4,737,469 A | 4/1988 | Stevens | |
| 4,757,028 A | 7/1988 | Kondoh et al. | |
| 4,762,806 A | 8/1988 | Suzuki et al. | |
| 4,803,526 A | 2/1989 | Terada et al. | |
| 4,897,710 A | 1/1990 | Suzuki et al. | |
| 4,947,218 A | 8/1990 | Edmond et al. | |
| 5,121,174 A * | 6/1992 | Forgerson et al. | ......... 257/271 |
| 5,229,625 A | 7/1993 | Suzuki et al. | |
| 5,264,713 A | 11/1993 | Palmour | |
| 5,270,554 A | 12/1993 | Palmour | |
| 5,289,015 A | 2/1994 | Chirovsky et al. | |
| 5,300,795 A | 4/1994 | Saunier et al. | |
| 5,306,650 A | 4/1994 | O'Mara, Jr. et al. | |
| 5,396,085 A | 3/1995 | Baliga | |
| 5,399,883 A | 3/1995 | Baliga | |
| 5,482,875 A * | 1/1996 | Vaitkus et al. | ............. 438/172 |
| 5,510,630 A | 4/1996 | Agarwal et al. | |
| 5,686,737 A * | 11/1997 | Allen | .......................... 257/77 |

(Continued)

FOREIGN PATENT DOCUMENTS

DE 19900169 7/1999

(Continued)

OTHER PUBLICATIONS

*A 10 W 2 GHz Silicon Carbide MESFET*, Microwave Journal, Sep. 1999, pp. 232, 240, 242.

(Continued)

*Primary Examiner*—Mark V. Prenty
(74) *Attorney, Agent, or Firm*—Myers Bigel Sibley & Sajovec PA

(57) ABSTRACT

High power transistors are provided. The transistors include a source region, a drain region and a gate contact. The gate contact is positioned between the source region and the drain region. First and second ohmic contacts are provided on the source and drain regions, respectively. The first and second ohmic contacts respectively define a source contact and a drain contact. The source contact and the drain contact have respective first and second widths. The first and second widths are different. Related methods of fabricating transistors are also provided.

36 Claims, 6 Drawing Sheets

U.S. PATENT DOCUMENTS

| | | | |
|---|---|---|---|
| 5,719,409 | A | 2/1998 | Singh et al. |
| 5,742,082 | A | 4/1998 | Tehrani et al. |
| 5,869,856 | A | 2/1999 | Kasahara |
| 5,891,769 | A | 4/1999 | Liaw et al. |
| 5,895,939 | A | 4/1999 | Ueno |
| 5,900,648 | A | 5/1999 | Harris et al. |
| 5,925,895 | A | 7/1999 | Sriram et al. |
| 5,972,801 | A | 10/1999 | Lipkin et al. |
| 6,107,649 | A | 8/2000 | Zhao |
| 6,121,633 | A | 9/2000 | Singh et al. |
| 6,218,680 | B1 | 4/2001 | Carter, Jr. et al. |
| 6,316,793 | B1 | 11/2001 | Sheppard et al. |
| 6,670,687 | B2 * | 12/2003 | Satoh et al. ............... 257/471 |
| 6,686,616 | B1 | 2/2004 | Allen et al. |
| 2003/0017660 | A1 | 1/2003 | Li |
| 2003/0075719 | A1 | 4/2003 | Sriram |

FOREIGN PATENT DOCUMENTS

| | | |
|---|---|---|
| EP | 0 081 396 A2 | 6/1983 |
| EP | 0518 683 A1 | 12/1992 |
| EP | 1 306 905 A2 | 5/2003 |
| JP | 47-5124 | 3/1972 |
| JP | 54-155482 | 10/1979 |
| JP | 59134874 | 8/1984 |
| JP | 60-142568 | 7/1985 |
| JP | 60-154674 | 8/1985 |
| JP | 60-189250 | 9/1985 |
| JP | 63-47983 | 2/1988 |
| JP | 64-59961 | 3/1989 |
| JP | 1-106476 | 4/1989 |
| JP | 1-106477 | 4/1989 |
| JP | 1-196873 | 8/1989 |
| JP | 1-308876 | 12/1989 |
| JP | 2-10772 | 1/1990 |
| JP | 4-4225534 | 8/1992 |
| JP | 9-36359 | 2/1997 |
| JP | 11-150124 | 6/1999 |
| WO | WO98/19342 | 5/1998 |
| WO | WO 98/49732 A2 | 11/1998 |
| WO | WO98/49732 A2 | 11/1998 |
| WO | WO 01/67521 | 9/2001 |
| WO | WO 01/86727 | 11/2001 |

OTHER PUBLICATIONS

Allen, *Silicon Carbide MESFET's with 2W/mm and 50% P.A.E. at 1.8 GHz*, 1996, Dec. 1996.

Browne, Editorial: *The Power and the Glory*, Microwaves & RF, Jul. 1999, p. 17.

Browne, *SiC MESFET Delivers 10-W Power at 2GHZ*, Microwaves & RF, Oct. 1999, pp. 138-139.

Browne, *Top Products of 1999*, Microwaves &RF, Dec. 1999, pp. 223-233.

Carter et al., *Silicon Carbide and Related Materials, 1999, Part 2, Materials Science Forum*, vols. 338-342, pp. 1247-1266 (2000), Dec. 2000.

Evwaraye et al., "Examination of Electrical and Optical Properties of Vanadium in Bulk n-Type Silicon Carbide," *J. Appl. Phys.* vol. 76, No. 10, 1994, Nov. 1994.

*First Silicon Carbide Microwave Power Products Are Introduced*, Applied Microwave & Wireless, pp. 104, Dec. 2000.

Heftman, *Wireless Semi Technology Heads Into New Territory*, Microwaves & RF, Feb. 2000, pp. 31-38.

Hilton et al., *Suppression of Instabilities in 4H-SiC Microwave MESFETs*, 2000 8th IEEE International Symposium, Dec. 2000.

Hilton et al., *Surface Induced Instabilities in 4H-SiC Microwave MESFETs*, Materials Science Forum, vols. 338-342, 2000, pp. 1251-1254, Dec. 2000.

Jonsson et al., *Physical Simulations on the Operations of 4H-SiC Microwave Power Transistors*, Materials Science Forum, vols. 338-342, 2000, pp. 1263-1266, Dec. 2000.

Kelner et al., $\beta$-*SiC MESFET's and Buried-Gate JFET's*, IEEE Electron Device Letters, vol. EDL-8, No. 9, Sep. 1987, pp. 428-430.

Kong et al., *Temperature Dependence of the Current-Voltage Characteristics of Metal-Semiconductor Field-Effect Transistors in n-Type $\beta$-SiC Grown Via Chemical Vapor Deposition*, Appl. Phys Lett., vol. 51, No. 6, Aug. 10, 1987, pp. 442-444.

Konstantinov et al., *High Performance Silicon Carbide MESFET Utilizing Lateral Epitaxy, Materials Science Forum*, vols. 389-393, pp. 1375-1378, Dec. 2002.

Konstantinov et al., *Investigation of Lo-Hi-Lo and Delta-Doped Silicon Carbide Structures*, Mat. Res. Soc. Symp. Proc., vol. 640, 2001, pp. H2.4.1-H2.4.6, Dec. 2001.

Ma, et al., *High Efficiency LDMOS Power FET for Low Voltage Wireless Communications*, 1996 IEEE, Dec. 1996.

Nilsson et al., *Characterization of SiC MESFETs on Conducting Substrates*, Materials Science Forum, vols. 338-342, 2000, pp. 1255-1258, Dec. 2000.

Noblanc et al., *Power Density Comparison Between Microwave Power MESFET's Processed on Conductive and Semi-Insulating Wafer*, Materials Science Forum, vols. 338-342, 2000, pp. 1247-1250, Dec. 2000.

Palmour et al., *Characterization of Device Parameters in High-Temperature Metal-Oxide-Semiconductor Field Effect Transistors in $\beta$-SiC Thin Films*, J. Appl. Phys, vol. 64, No. 4, Aug. 15, 1988, pp. 2168-2177.

Palmour et al., *High-Temperature Depletion-Mode Metal-Oxide-Semiconductor Field Effect Transistors in Beta-SiC Thin Films*, Appl. Phys. Lett., vol. 51, No. 24, Dec. 14, 1987, pp. 2028-2030.

Palmour et al., *Ultrafast Silicon-Carbide Rectifiers*, Powertechnics Magazine, Aug. 1989, pp. 18-21.

Rorsman et al., *Fabrication, Characterization and Modeling of SiC MESFETs*, Materials Science Forum, vols. 338-342, 2000, pp. 12-59-1262, Dec. 2000.

*SiC MESFET Drives PCS Base Stations*, Wireless Systems Design, Oct. 1999, pp. 24.

Soares, ed., *GaAs MESFET Circuit Design*, Artech House, 1988, pp. 7-9, 17-18, Dec. 1988.

Sze, *Physics of Semiconductor Devices, Second Edition*, John Wiley & Sons, 1981, pp. 341-347, Dec. 1981.

Yokogawa et al., *Electronic Properties of Nitrogen Delta-Doped Silicon Carbide Layers*, Mat. Res. Soc. Symp. Proc., vol. 640, 2001, pp. H2.5.1-H2.5.6, Jun. 2001.

Invitation to Pay Additional Fees, Annex to Form PCT/ISA/206—Communication Relating to the Results of the Partial International Search, corresponding to International Application No. PCT/US2005/030254, mailed Dec. 4, 2006.

International Search Report and Written Opinion of the International Searching Authority, corresponding to International Application No. PCT/US2005/030254, mailed Jan. 30, 2007.

* cited by examiner

ASYMETRIC LAYOUT STRUCTURES FOR TRANSISTORS AND METHODS OF FABRICATING THE SAME

STATEMENT OF GOVERNMENT INTEREST

This invention was made with Government support under contract number N00014-02-C-0250 awarded by the Department of the Navy. The Government has certain rights in this invention.

FIELD OF THE INVENTION

The present invention relates to microelectronic devices and more particularly to transistors, for example, metal-semiconductor field-effect transistors (MESFETs).

BACKGROUND OF THE INVENTION

Electrical circuits requiring high power handling capability while operating at high frequencies such as radio frequencies, S-band and X-band have in recent years become more prevalent. Because of the increase in high power, high frequency circuits there has been a corresponding increase in demand for transistors that are capable of reliably operating at radio frequencies and above while still being capable of handling higher power loads.

Metal-semiconductor field effect transistors (MESFETs) have been developed for high frequency applications. The MESFET construction may be preferable for high frequency applications because only majority carriers carry current. The MESFET design may be preferred over MOSFET designs because the reduced gate capacitance permits faster switching times of the gate input. Therefore, although all field-effect transistors utilize only majority carriers to carry current, the Schottky gate structure of the MESFET may make the MESFET more desirable for high frequency applications.

In addition to the type of structure, and perhaps more fundamentally, the characteristics of the semiconductor material from which a transistor is formed also affects the operating parameters. Of the characteristics that affect a transistor's operating parameters, the electron mobility, saturated electron drift velocity, electric breakdown field and thermal conductivity may have the greatest effect on a transistor's high frequency and high power characteristics.

Electron mobility is the measurement of how rapidly an electron is accelerated to its saturated velocity in the presence of an electric field. In the beyond, semiconductor materials which have a high electron mobility were preferred because more current could be developed with a lesser field, resulting in faster response times when a field is applied. Saturated electron drift velocity is the maximum velocity that an electron can obtain in the semiconductor material. Materials with higher saturated electron drift velocities may be preferred for high frequency applications because the higher velocity translates to shorter times from source to drain.

Electric breakdown field is the field strength at which breakdown of the Schottky junction and the current through the gate of the device suddenly increases. A high electric breakdown field material may be preferred for high power, high frequency transistors because larger electric fields generally can be supported by a given dimension of material. Larger electric fields allow for faster transients as the electrons can be accelerated more quickly by larger electric fields than by smaller.

Thermal conductivity is the ability of the semiconductor material to dissipate heat. In typical operations, all transistors generate heat. In turn, high power and high frequency transistors usually generate larger amounts of heat than small signal transistors. As the temperature of the semiconductor material increases, the junction leakage currents generally increase and the current through the field effect transistor generally decreases due to a decrease in carrier mobility with an increase in temperature. Therefore, if the heat is dissipated from the semiconductor, the material will remain at a lower temperature and be capable of carrying larger currents with lower leakage currents.

To provide increased power handling capabilities, transistors with a larger effective area have been developed. However, as the area of a transistor increases, the transistor, typically, becomes less suitable for high frequency operations. One technique for increasing the area of a transistor while still providing for high frequency operations is to use a plurality of transistor cells that are connected in parallel. Such may be provided using a plurality of gate fingers, thus, the source to drain distance may be kept relatively small while still providing for increased power handling capability. When a plurality of parallel transistor cells are connected in parallel on a single chip, the cells are, typically, evenly spaced such that the gate-to-gate distance between adjacent cells (referred to herein as "pitch" or "gate pitch") is uniform.

When such multi-cell transistors are used in high frequency operations, they may generate a large amount of heat. As a device heats up, performance of the device typically degrades. Such degradation may be seen in gain, linearity and/or reliability. Thus, efforts have been made to keep junction temperatures of the transistors below a peak operating temperature. Typically, heatsinks and/or fans have been used to keep the devices cool so as to ensure proper function and reliability. However, cooling systems may increase size, electrical consumption, costs and/or operating costs of systems employing such transistors.

As discussed above, conventional FETs may be interdigitated structures with multiple unit cells, each unit cell having a source, a drain and a gate. The pitch may determine a temperature rise of the FET. In other words, a wide pitch may be provided to reduce the amount of the temperature rise of the FET. However, FETs having wide pitches may also experience higher drain to source capacitances ($C_{ds}$), which may not provide desirable device characteristics. In particular, high source to drain capacitances may be undesirable in wide bandwidth amplifiers. Accordingly, further improvements may be made with respect to existing FET devices such that they may provide lower drain to source capacitances ($C_{ds}$) without sacrificing other performance characteristics of the device, such as thermal device characteristics.

SUMMARY OF THE INVENTION

Some embodiments of the present invention provide unit cells of high power transistors. The unit cells include a transistor having a source region, a drain region and a gate contact. The gate contact is positioned between the source region and the drain region. First and second ohmic contacts are provided on the source and drain regions, respectively. The first and second ohmic contacts respectively define a source contact and a drain contact. The source contact and the drain contact have respective first and second widths. The first and second widths are different.

In further embodiments of the present invention, the first width may be less than an average width of the first and second widths and the second width may be greater than the average width of the first and second widths. In certain embodiments of the present invention, the second width may be less than an average width of the first and second widths and the first width may be greater than the average width of the first and second widths.

In still further embodiments of the present invention, the source region and the drain region may have respective third and fourth widths that are different. The source contact and the source region may be split into first and second portions such that a portion of a surface of an epitaxial layer may not be disposed beneath the source contact or the source region or the drain contact and the drain region may be split into first and second portions such that a portion of the surface of the epitaxial layer may not be disposed beneath the drain contact or the drain region.

In some embodiments of the present invention, the source contact may be split into at least first and second portions such that a portion of a surface of the source region is not disposed beneath the source contact. In other embodiments of the present invention, the drain contact may be split into at least first and second portions such that a portion of a surface of the drain region is not disposed beneath the drain contact.

In further embodiments of the present invention, the transistor may be a metal semiconductor field effect transistor (MESFET). The MESFET may be a silicon carbide (SiC) MESFET, a gallium arsenide (GaAs) MESFET or a gallium Nitride (GaN) HEMT.

Still further embodiments of the present invention provide unit cells of high power transistors. The unit cells include a transistor having a source region, a drain region and a gate contact. The gate contact may be provided between the source region and the drain region. First and second ohmic contacts are provided on the source and drain regions, respectively. The first and second ohmic contacts respectively define a source contact and a drain contact. The source contact is split into at least first and second portions such that a portion of a surface of an epitaxial layer may not be disposed beneath the source contact or the drain contact is split into at least first and second portions such that a portion of the surface of the epitaxial layer may not be disposed beneath the drain contact.

In some embodiments of the present invention, the source contact may be split into at least first and second portions such that a portion of a surface of the source region is not disposed beneath the source contact or the drain contact may be split into at least first and second portions such that a portion of a surface of the drain region is not disposed beneath the drain contact.

In further embodiments of the present invention, the source contact may be split and the source and drain contacts may have respective first and second widths. The first width may be less than an average of the first and second widths and the second width may be greater than the average of the first and second widths. In other embodiments of the present invention, the first width may be greater than an average of the first and second widths and the second width may be less than the average of the first and second widths. In still other embodiments of the present invention, the first and second widths may be equal.

In still further embodiments of the present invention, the drain contact may be split and the source and drain contacts may have respective first and second widths. The first width may be less than an average of the first and second widths and the second width may be greater than the average of the first and second widths. In other embodiments of the present invention, the first width may be greater than an average of the first and second widths and the second width may be less than the average of the first and second widths. In still other embodiments of the present invention, the first and second widths may be equal.

Some embodiments of the present invention provide high power transistors. The high power transistors include a plurality of unit cells each having a source region and a drain region. A plurality of gate electrodes of the unit cells are provided. The plurality of gate electrodes are provided between respective source and drain regions of the unit cells. A plurality of source electrodes are provided on the source regions of the unit cells. A plurality of drain electrodes are provided on the drain regions of the unit cells. The plurality of source electrodes and the plurality of drain electrodes have respective first and second widths. The first width is less than an average width of the first and second widths and the second width is greater than the average width of the first and second widths.

Further embodiments of the present invention provide high power transistors. The high power transistors include a plurality of unit cells each having a source region and a drain region. A plurality of gate electrodes of the unit cells are provided. The plurality of gate electrodes are provided between respective source and drain regions of the unit cells. A plurality of source electrodes are provided on the source regions of the unit cells. A plurality of drain electrodes are provided on the drain regions of the unit cells. The plurality of source electrodes and the plurality of source regions are split into at least first and second portions such that a portion of a surface of an epitaxial layer may not be disposed beneath the source electrodes or the source regions or the plurality of drain contacts and the plurality of drain regions are split into at least first and second portions such that a portion of the surface of the epitaxial layer may not be disposed beneath the drain electrodes or the drain regions.

While the present invention is described above primarily with reference to MESFETs, other types of transistors as well as methods of fabricating transistors and, in particular, MESFETs are also provided.

DETAILED DESCRIPTION OF THE INVENTION

Figure 1:
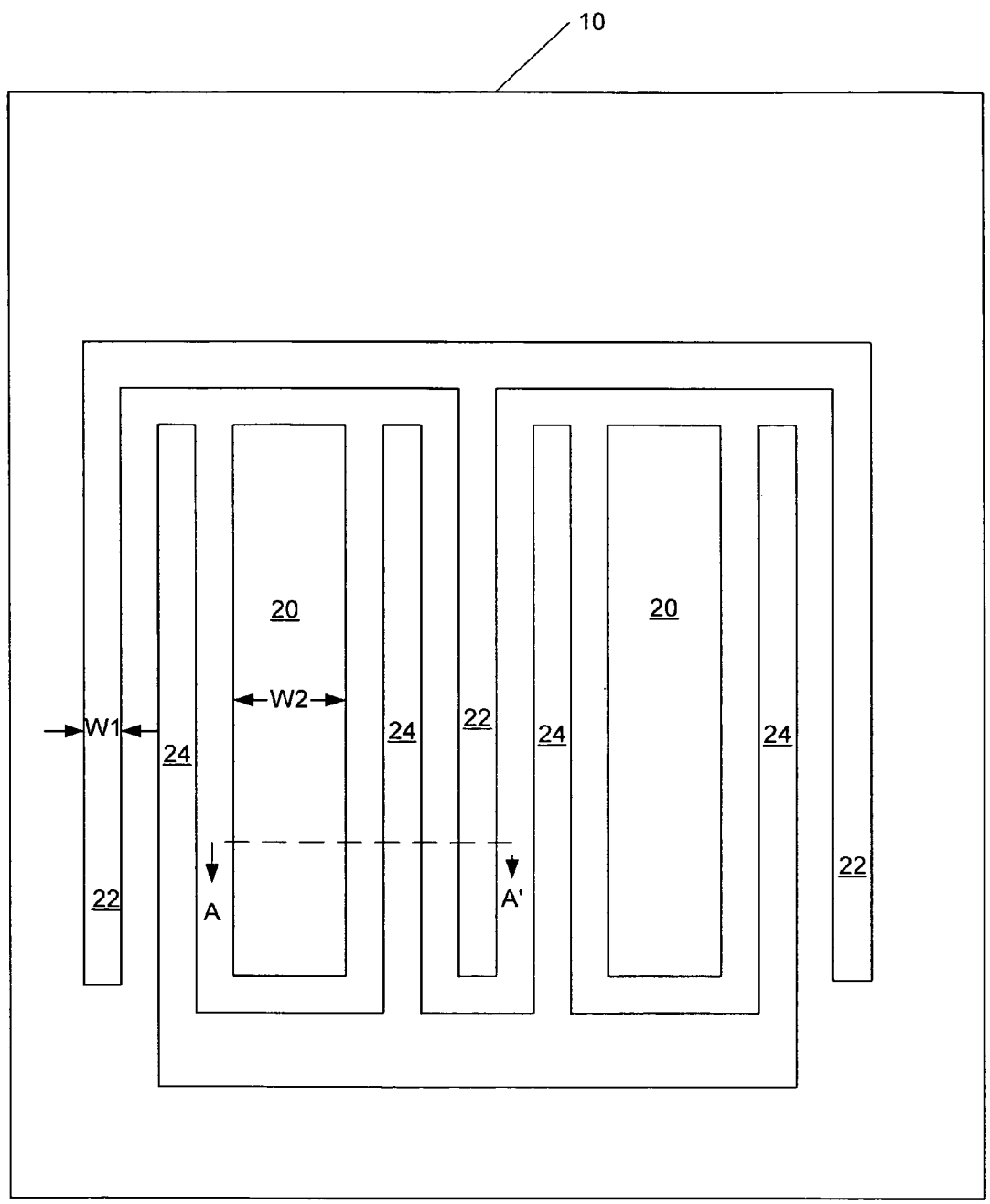
FIG. 1 is a plan view of a transistor according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, the term "and/or" includes any and all combinations of one or more of the associated listed items. Like numbers refer to like elements throughout.

It will be understood that although the terms first and second are used herein to describe various regions, layers and/or sections, these regions, layers and/or sections should not be limited by these terms. These terms are only used to distinguish one region, layer or section from another region, layer or section. Thus, a first region, layer or section discussed below could be termed a second region, layer or section, and similarly, a second region, layer or section may be termed a first region, layer or section without departing from the teachings of the present invention.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the precise shape of a region of a device and are not intended to limit the scope of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein the term "ohmic contact" refers to contacts where an impedance associated therewith is substantially given by the relationship of Impedance=V/I, where V is a voltage across the contact and I is the current, at substantially all expected operating frequencies (i.e., the impedance associated with the ohmic contact is substantially the same at all operating frequencies) and currents.

Embodiments of the present invention will now be described in detail below with reference to FIGS. 1 through 6 that illustrate various embodiments of the present invention and various processes of fabricating embodiments of the present invention. Transistors, for example, a metal-semiconductor field effect transistors (MESFETs), according to some embodiments of the present invention, may be provided having reduced drain to source capacitance ($C_{ds}$) without having substantially increased temperatures. In particular, in some embodiments of the present invention, a first width of one of a drain or a source contact may be narrower than a second width of the other of the drain or the source contact, which may reduce the $C_{ds}$ of the transistor. The average width of the one of the source contact or drain contact may be reduced by a certain amount to provide the first width and the average width of the other of the source or drain may be increased by the same amount to provide the second width. Thus, the average pitch, i.e., a distance between a gate contact of a first unit cell of the transistor and a gate contact of a second unit cell of the transistor, may be maintained. Since the overall pitch is maintained, the temperature of the device may not increase and the $C_{ds}$ be reduced. In further embodiments of the present invention, one of the source contact or the drain contact may be split into first and second portions exposing a surface of a surface of the substrate between the contact portions. The absence of metal between the contact portions, may provide a reduced $C_{ds}$ and also allow the temperature of the device to be maintained. Details with respect to embodiments of the present invention will be discussed further herein.

As further discussed herein, transistors according to some embodiments of the present invention may be useful in, for example, high efficiency linear power amplifiers, such as power amplifiers for base stations using complex modulation schemes such as code division multiple access (CDMA) and/or Wideband CDMA (WCDMA). Transistors according to further embodiments of the present invention may be used in wide bandwidth hybrid and Microwave Monolithic Integrated Circuit (MMIC) amplifiers, particularly those that use silicon carbide (SiC) MESFETs.

Referring now to FIG. 1, a plan view of transistors, for example, MESFETs according to some embodiments of the present invention will be discussed. As illustrated in FIG. 1, a plurality of unit cells are provided on a substrate 10. Each unit cell includes a drain contact 22, a gate contact 24 and a source contact 20, the gate contacts 24 are situated between the source contacts 20 and the drain contacts 22. The source contacts 20, the gate contacts 24 and the drain contacts 22 are interdigitated. As further illustrated in FIG. 1, a first width W1 of the drain contacts 22 are narrower than a second width W2 of the source contacts 20. Thus, the first width W1 is less than an average width (W1, W2) and the second width W2 is greater than the average width (W1, W2).

In some embodiments of the present invention, the width of a conventional (average width) drain contact may be reduced by a certain amount, x, to provide the first width W1 of the drain contact 22. Similarly, the width of a conventional source contact may be increased by the same amount x to provide the second width W2 of the source contact 20. For example, if conventional drain and source contacts have a width of 20 μm, the width of the drain contact may be reduced by 5 μm to yield a first width W1 of 15 μm. Similarly, the width of the conventional source contact may be increased by 5 μm to yield a second width W2 of 25 μm. Thus, the net change in the pitch, i.e., the distance between a first gate contact 24 and a second gate contact 24 of first and second unit cells, respectively, may be close to zero. In some embodiments of the present invention, an average pitch of the device may be from about 20 μm to about 100 μm, but typically from about 20 μm to about 80 μm.

It will be understood that although embodiments of the present invention are discussed herein as having a drain contact that is narrower than a source contact, embodiments of the present invention are not limited to this configuration. For example, in some embodiments of the present invention, the source contact may be narrower than the drain contact without departing from the teachings of the present invention.

While embodiments of the present invention illustrated in FIG. 1 include four gate electrodes (fingers) 24, two source electrodes 20 and three drain electrodes 22, other numbers of these electrodes may be utilized. Furthermore, other MESFET or semiconductor device configurations may also be utilized. For example, devices such as those described in commonly assigned U.S. patent application Ser. No. 09/567,717, filed on May 10, 2000 entitled Silicon Carbide Metal-Semiconductor Field Effect Transistors and Methods of Fabricating Silicon Carbide Metal-Semiconductor Field Effect Transistors; U.S. Patent Publication No. US 2003/0075719, filed on Oct. 24, 2001 entitled Delta Doped Silicon Carbide Metal-Semiconductor Field Effect Transistors Having a Gate Disposed in a Double Recess Structure; and U.S. Patent Application Publication No. 2004/0099888, filed on Nov. 26, 2003, entitled Transistors Having Buried P-Type Layers Beneath The Source Region And Methods Of Fabricating The Same, the disclosures of which are incorporated herein as if set forth fully, may be utilized in embodiments of the present invention. Furthermore, embodiments of the present invention are not limited to MESFETs, but may be utilized with other devices.

Figure 2:
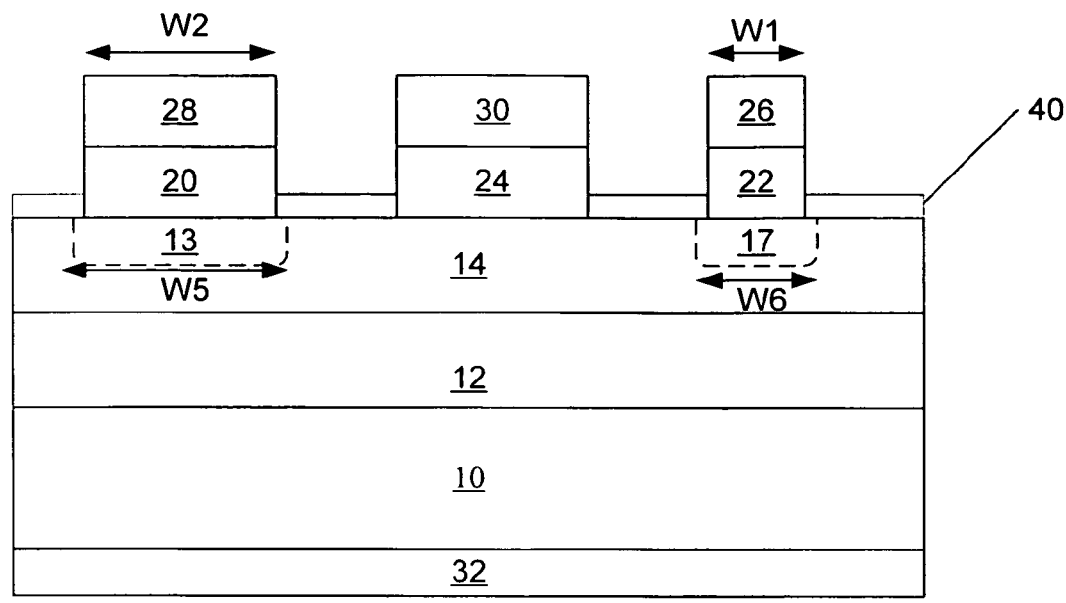
FIG. 2 is a cross section taken along the line A-A' of FIG. 1.

Referring now to FIG. 2, a cross-section along the A-A' of FIG. 1 will be discussed. FIG. 2 illustrates a unit cell of transistors according to some embodiments of the present invention. While embodiments of the present invention are discussed herein with reference to SiC MESFETs, the present invention should not be construed as limited to such devices. Embodiments of the present invention may be suitable for use in any semiconductor device where a more/relatively uniform junction temperature is desired or a peak junction temperature is to be maintained without an increase in drain to source capacitance ($C_{ds}$) and multiple unit cells of the device are present. Thus, for example, embodiments of the present invention may be suitable for use in non-silicon carbide devices, such as gallium nitride (GaN), gallium arsenide (GaAs) and/or silicon (Si) devices. Accordingly, embodiments of the present invention may provide, for example, SiC MESFETs, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

As illustrated in FIG. 2, a unit cell of MESFETs incorporating embodiments of the present invention may include a first epitaxial layer 12 of p-type conductivity grown on a single crystal bulk silicon carbide substrate 10 of either p-type or n-type conductivity or semi-insulating. The substrate 10 may include 6H, 4H, 15R or 3C silicon carbide. The first epitaxial layer 12 is disposed between the substrate 10 and an n-type epitaxial layer 14. An optional metallization layer 32 may be formed on the backside of the substrate 10, opposite the first epitaxial layer 12.

It will be understood that the first epitaxial layer 12 may be a p-type conductivity silicon carbide epitaxial layer, an undoped silicon carbide epitaxial layer or a very low doped n-type conductivity silicon carbide epitaxial layer without departing from the teachings of the present invention. If a low doped silicon carbide epitaxial layer is utilized, in certain embodiments, the doping concentration of the first epitaxial layer 12 may be less than about $5 \times 10^{15}$ cm$^{-3}$. If an undoped or n-type first epitaxial layer 12 is utilized, then in certain embodiments, the substrate 10 is a semi-insulating silicon carbide substrate. If an undoped or n-type first epitaxial layer 12 is utilized, a high quality channel layer may be formed without the buffer layer having any significant electrical effect on the transistor.

As further illustrated in FIG. 2, n⁺ regions 13 and 17 are provided that respectively define the source region and the drain region of the device. As used herein, "p⁺" or "n⁺" refer to regions that are defined by higher carrier concentrations than are present in adjacent or other regions of the same or another layer or substrate. The source and drain regions 13 and 17 are typically of n-type conductivity silicon carbide and have carrier concentrations that are greater than the carrier concentration of the first epitaxial layer 14. For the source and drain regions 13 and 17, carrier concentrations of about $1 \times 10^{19}$ cm$^{-3}$ may be suitable, but carrier concentrations as high as possible are preferred. As illustrated in FIG. 2, a width W5 of the source region 13 may be greater than a width W6 of the drain region 17.

Ohmic contacts 20 and 22 may be formed on the second epitaxial layer 14 and are spaced apart so as to provide a source contact 20 and a drain contact 22. As illustrated ohmic contacts 20 and 22 may be provided on the implanted source and drain regions 13 and 17, respectively. A Schottky gate contact 24 is formed on the second epitaxial layer 14 between the source contact 20 and the drain contact 22. As illustrated, optional metal overlayers 26, 28 and 30 are formed on the drain and source contacts 22 and 20 and the Schottky gate contacts 24, respectively. A passivation layer 40 may also be provided. As further illustrated in FIG. 1, according to some embodiments of the present invention, a first width W1 of the drain contact 22 is narrower than a second width W2 of the source contact 20. In some embodiments of the present invention, the drain contact 22 may have a width of from about 10 to about 20 μm and the source contact may have a width of from about 25 to about 35 μm.

The gate contact 24 may be formed of chromium, platinum, platinum silicide, nickel, and/or TiWN, however, other metals such as gold, known to one skilled in the art to achieve the Schottky effect, may be used. The Schottky gate contact 24 typically has a three layer structure. Such a structure may have advantages because of the high adhesion of chromium (Cr). For example, the gate contact 24 can optionally include a first gate layer of chromium (Cr) contacting the second epitaxial layer 14. The gate contact 24 may further include an overlayer of platinum (Pt) and gold 30 or other highly conductive metal.

Figure 3A:
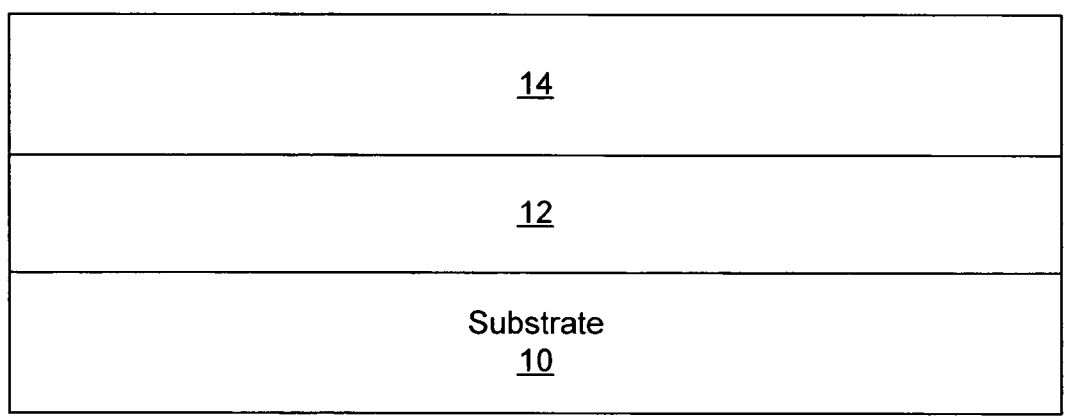
FIGS. 3A through 3E are cross sections illustrating processing steps in the fabrication of transistors according to embodiments of the present invention illustrated in FIGS. 1 and 2.

Processing steps in the fabrication of transistors according to some embodiments of the present invention illustrated in FIGS. 1 and 2 will now be discussed with respect to FIGS. 3A through 3E. As seen in FIG. 3A, a first epitaxial layer 12 may be grown or deposited on a substrate 10. The substrate 10 may be a semi-insulating substrate, a p-type substrate or an n-type substrate. The substrate 10 may be very lightly doped. If the substrate 10 is semi-insulating it may be fabricated as described in commonly assigned U.S. Pat. No. 6,218,680 to Carter et al. entitled "Semi-insulating Silicon Carbide Without Vanadium Domination", the disclosure of which is hereby incorporated by reference herein as if set forth in its entirety. Other techniques for providing semi-insulating substrates may also be used. The buffer layer 12 may be of p-type conductivity silicon carbide having a carrier concentration of about $3.0 \times 10^{15}$ cm$^{-3}$ or less, but typically $1.0 \times 10^{15}$ cm$^{-3}$ or less. Alternatively, the buffer layer 12 may be n-type silicon carbide or undoped (not intentionally doped) silicon carbide. As further illustrated in FIG. 3A, a second epitaxial layer 14 is grown or deposited on the first epitaxial layer 12.

Figure 3B:
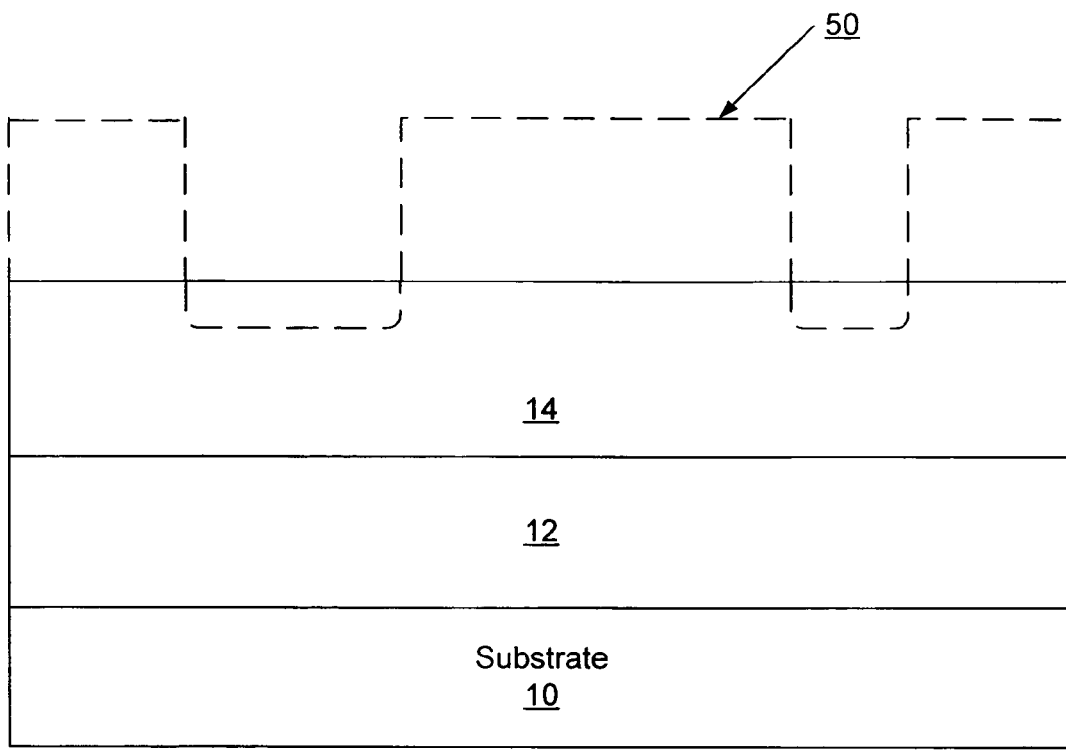
Figure 3C:
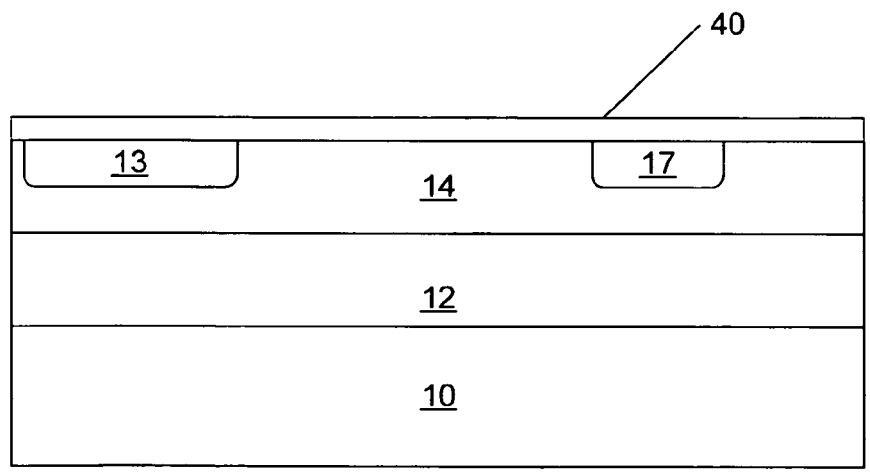

As illustrated in FIG. 3B, a mask 50 may be formed for implanting n$^+$ regions 13 and 17 that respectively define a source region and a drain region. The source and drain regions 13 and 17 are typically formed by ion implantation of, for example, nitrogen (N) or phosphorus (P), followed by a high temperature anneal. Suitable anneal temperatures may be from about 1100 to about 1600° C. The ion implantation may be performed on the regions which are not covered by the mask 50 to form n$^+$ regions 13 and 17 as illustrated in FIG. 3C. Thus, the ions are implanted in portions of the second epitaxial layer 14 to provide highly doped regions of n-type conductivity, for example, n-type conductivity SiC, having higher carrier concentrations greater than the second epitaxial layer 14. Once implanted, the dopants may be annealed to activate the implant.

As illustrated in FIG. 3C, an insulator layer 40, for example, an oxide layer on a surface of the device. The insulator layer 40 may be grown or deposited over the exposed surface of the existing structure, i.e. on the source and drain regions 13 and 17 and the second epitaxial layer 14. It will be understood that in some embodiments of the present invention a mesa may be provided around the perimeter of the MESFET. The mesa may have sidewalls defined by the substrate 10, the first epitaxial layer 12 and the second epitaxial layer 14 that define the periphery of the transistor. The mesa may extend past the depletion region of the device to confine current flow in the device to the mesa and reduce the capacitance of the device. The mesa may be formed by reactive ion etching the above described device, however, other methods known to one skilled in the art may be used to form the mesa. Furthermore, if a mesa is not utilized the device may be isolated using other methods such as proton bombardment, counterdoping with compensating atoms or other methods known to those skilled in the art.

Figure 3D:
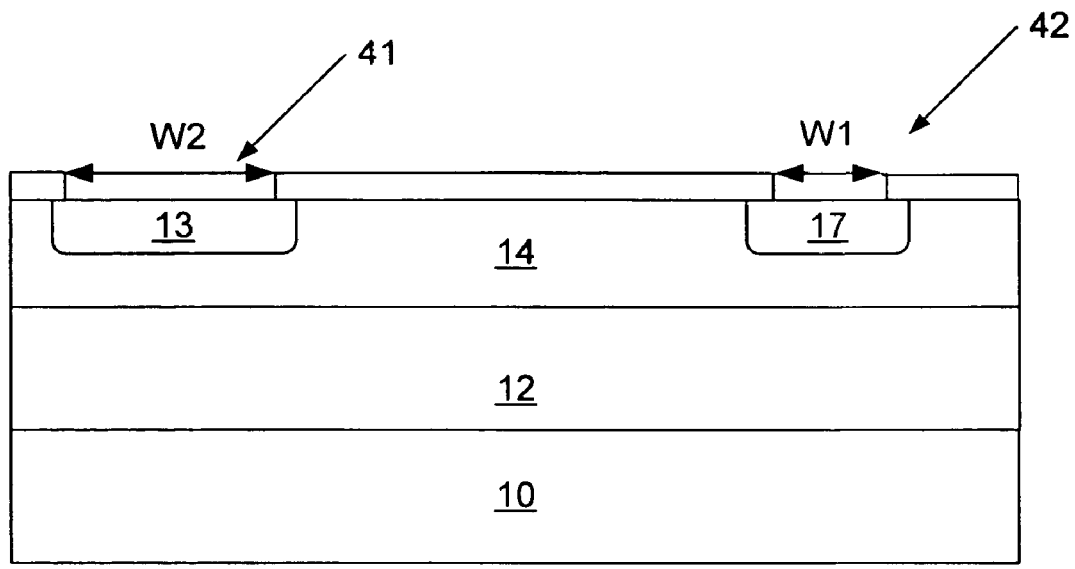
Figure 3E:
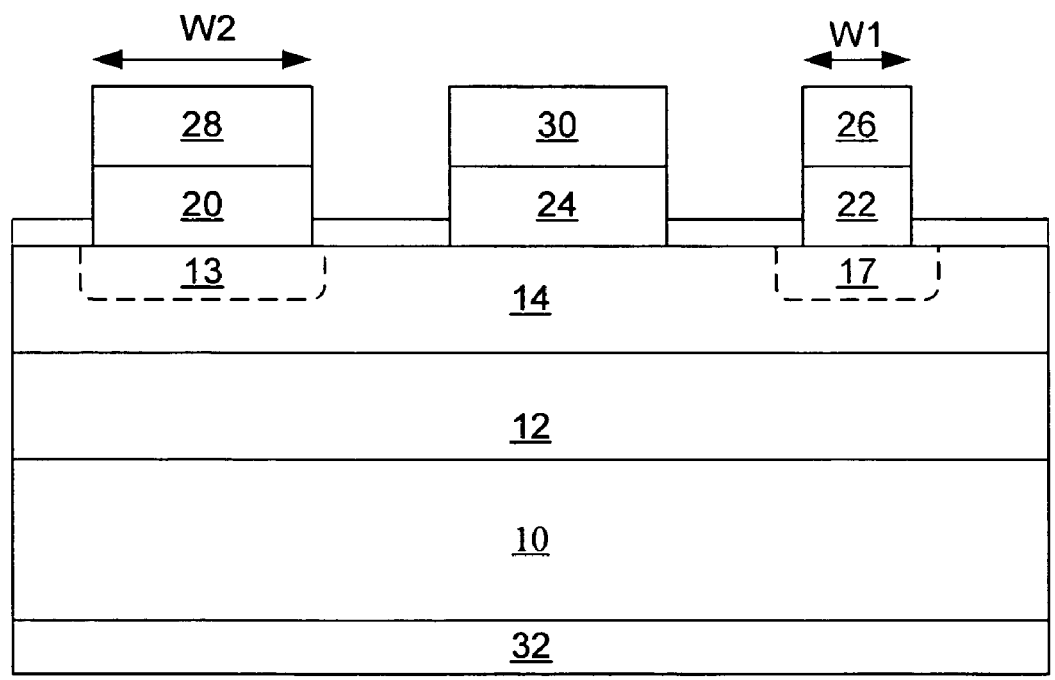

Referring now to FIG. 3D, contact windows 41 and 42 may be etched through the insulator layer 40 to expose a portion of a surface of the source region 13 and drain region 17. As illustrated, the window 42 for that exposes the surface of the drain region 17 has a first width W1, which is narrower than a second width W2 of the window 41 that exposes the surface of the source region 13. Nickel may then be evaporated to deposit the source and drain contacts 20 and 22, respectively. The nickel may be annealed to form the ohmic contacts 22 and 20 as illustrated in FIG. 3E. Such a deposition and annealing process may be carried out utilizing conventional techniques known to those of skill in the art. For example, the ohmic contacts 22 and 20 may be annealed at a temperature of from about 650° C. to about 1200° C. for about 2 minutes. However, other times and temperatures may also be utilized. Times from about 30 seconds to about 10 minutes may be, for example, acceptable.

FIG. 3E illustrates the formation of the gate contact 24 and the overlayers 28, 30 and 26. For example, a contact window (not shown) may be opened in the insulator 20 and a layer of chromium may be deposited in the window. Typically, the chromium layer is formed by evaporative deposition. The gate structure may then be completed by deposition of platinum and gold. As will also be appreciated by those of skill in the art, the overlayers 28 and 26 may be formed either before or after formation of the gate structure. In fact, if a titanium/platinum/gold structure is utilized, the platinum and gold portions of the overlayers may be formed in the same processing steps as the platinum and gold portions 30 of the gate structure. Accordingly, the overlayers 28 and 26 may be formed prior to the formation of a gate contact or after the formation of a gate contact. As further illustrated, a substrate contact 32 may be provided on the backside of the substrate 10.

In some embodiments of the present invention, the ohmic contacts may be the same or similar to contacts discussed in commonly assigned U.S. patent application Ser. No. 10/884,930, filed Jul. 6, 2004, entitled Silicon-Rich Nickel Silicide Ohmic Contacts for SiC Semiconductor Devices, which has been published as U.S. Patent Publication No. 2006/0006393, the disclosure of which is incorporated herein by reference as if set forth in its entirety.

As further illustrated in FIG. 3E, according to some embodiments of the present invention, the drain contact 22 is narrower than the source contact 20. The first width W1 may be less than an average width (W1, W2) and the second width W2 may be greater than the average width (W1, W2). Although embodiments of the present invention are discussed herein as having a narrow drain contact, embodiments of the present invention are not limited to this configuration. For example, in further embodiments of the present invention, the source contact 20 may be narrower than the drain contact 22 without departing from the teachings of the present invention.

Figure 4:
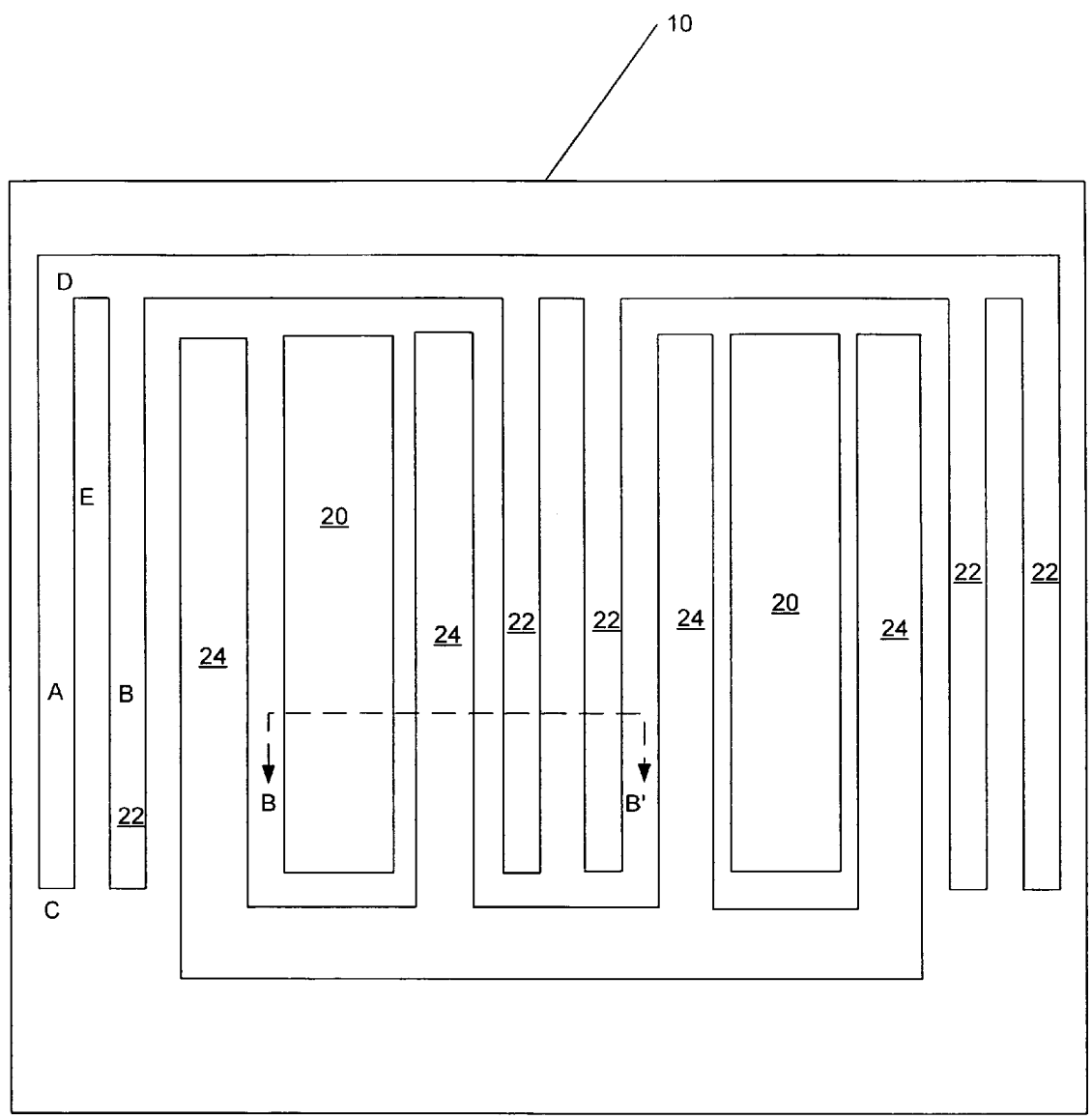
FIG. 4 is a plan view of transistors according to further embodiments of the present invention.
Figure 5:
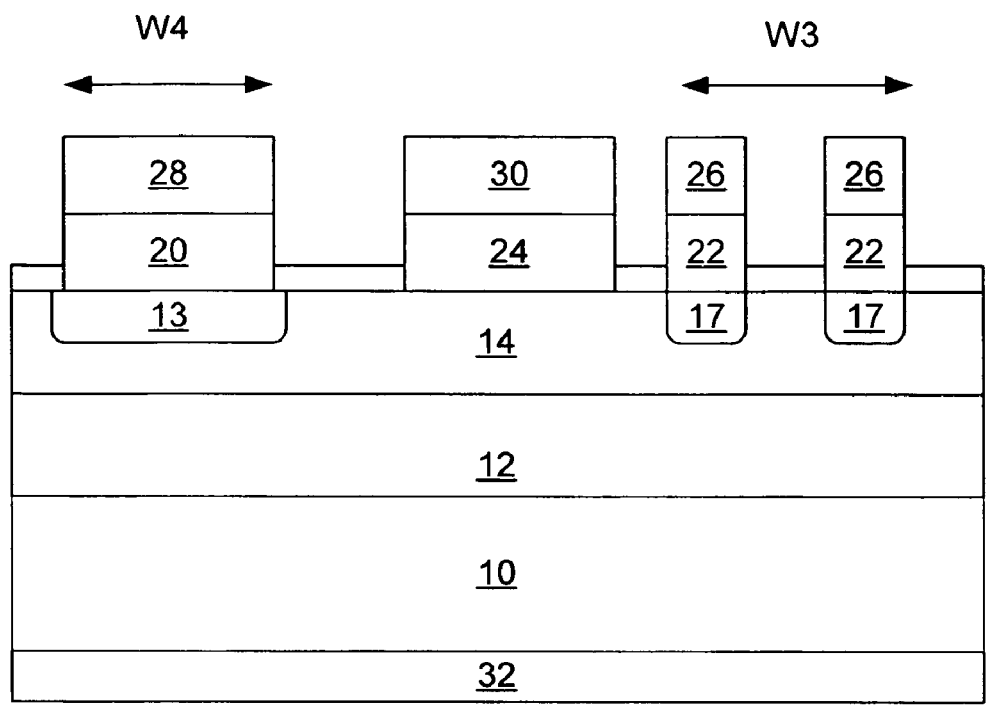
FIG. 5 is cross-section taken along the line B-B' of FIG. 4

Referring now to FIG. 4, a plan view of transistors, for example, MESFETs, according to further embodiments of the present invention will be discussed. As illustrated in FIG. 4, a plurality of unit cells are provided on a substrate 10. Each unit cell includes a drain contact 22, a gate contact 24 and a source contact 20, the gate contacts 24 are situated between the source contacts 20 and a drain contacts 22. The source contacts 20, the gate contacts 24 and the drain contacts 22 are interdigitated. As further illustrated in FIG. 4, the drain contacts 22 have first C and second D ends, one of which is split. Thus, the drain contact 22 is split into first A and second B portions such that a portion E of a surface of the first epitaxial layer is not disposed beneath the drain contact 22. It will be understood that the drain 22 may be split into three or more portions without departing from the teachings of the present invention. In some embodiments of the present invention, the drain region 17 may also be split as illustrated in FIG. 5. However, embodiments of the present invention are not limited to the configuration illustrated in FIG. 5. For example, in some embodiments of the present invention, the drain region 17 may not be split without departing from the scope of the present invention.

In some embodiments of the present invention, a width W3 of the split drain contact 22 may be equal to a width W4 of the source contact 20, narrower than the width W4 of the source contact 20 or wider than the width W4 of the source contact 20 without departing from the scope of the present invention. Furthermore, some embodiments of the present invention may combine the teachings of the first and second embodiments of the present invention. For example, a split drain contact 22 may be provided having a width W3 wider than an average width (W3, W4) and a source contact 20 may be provided having a width narrower than an average width (W3, W4) without departing from the teachings of the present invention.

It will be understood that although embodiments of the present invention are discussed herein as having a drain contact that is split, embodiments of the present invention are not limited to this configuration. For example, the source contact may be similarly split without departing from the teachings of the present invention. Furthermore, the contact may be split into three or more pieces without departing from the teachings of the present invention.

Referring now to FIG. 5, a cross-section taken along the B-B' of FIG. 4 will be discussed. Like reference numerals refer to like elements throughout. Thus, common elements discussed above with respect to FIGS. 1 through 3E will not be discussed further herein. In particular, as illustrated in FIG. 5 the epitaxial layer 14 is exposed through the drain region 17 the drain contact 22.

Figure 6:
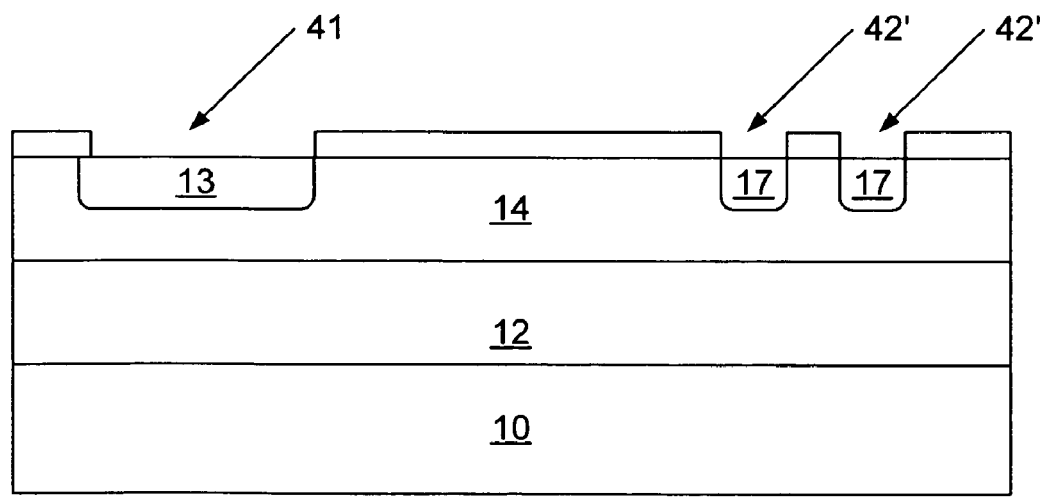
FIG. 6 is a cross-section illustrating processing steps in the fabrication of transistors according to embodiments of the present invention illustrated in FIGS. 4 and 5.

Embodiments of the present invention illustrated in FIGS. 4 and 5 may be fabricated using methods discussed above with respect to FIGS. 3A through 3E. However, the mask 50 of FIG. 3B may be adapted to implant a split drain region 17 as illustrated in FIGS. 5 and 6. Furthermore, the contact window 42' for the drain contact 22 has two portions as illustrated in FIG. 6 such that a portion of the drain region is not disposed beneath the drain contact 22.

As briefly discussed above, an average width of one of the source contact or drain contact may be reduced by a certain amount to provide the first width and the average width of the other of the source or drain may be increased by the same amount to provide the second width. Thus, the average pitch, i.e., a distance between a gate contact of a first unit cell of the transistor and a gate contact of a second unit cell of the transistor, may be maintained. Since the overall pitch is maintained, the temperature of the device may not increase and the $C_{ds}$ be reduced. In further embodiments of the present invention, one of the source contact or the drain contact may be split into first and second portions exposing a surface of a surface of the substrate between the contact portions. The absence of metal between the contact portions, may provide a reduced $C_{ds}$ and also allow the temperature of the device to be maintained.

The concepts proposed here were experimentally verified by fabricating test structures with different drain layer configurations. For example, the $C_{ds}$ measured at 3.5 GHz is summarized in Table 1 below and illustrates a reduction in the $C_{ds}$ according to some embodiments of the present invention.

TABLE 1

| Drain Width (microns) | Capacitance (femto farads) |
| --- | --- |
| 60 | 232 |
| 20 | 200 |
| 10 | 180 |
| Split drain, 10 μm | 216 |
| Split drain, 20 μm | 232 |

Although the present invention is described above with respect to particular MESFETs having particular layers and regions, it will be understood that embodiments of the present invention are not limited to the above described MESFETs. For example, embodiments of the present invention may be incorporated into devices described in commonly assigned U.S. Pat. No. 6,686,616 entitled Silicon Carbide Metal Semiconductor Field Effect Transistors to Allen et al.; U.S. patent application Ser. No. 10/786,962, entitled Semiconductor Devices Having Thermal Spacers; and U.S. Pat. Ser. No. 10/734,398, entitled Non-Uniform Gate Pitch Semiconductor Device, the disclosures of which are hereby incorporated herein by reference as if set forth in their entirety. Although the present invention is described above with reference to SiC MESFETs, the present invention is not limited to SiC MESFETs. For example, MESFETs according to embodiments of the present invention may be, for example, SiC MESFET MMICs, GaN HEMTs, GaN HEMT MMICs, GaAs MESFETs, GaAs MESFET MMICs, GaAs HEMTs, GaAs HEMT MMICs, GaAs pHEMTs, GaAs pHEMT MMICs and the like.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A unit cell of a high power transistor comprising:
   a transistor having a source region, a drain region and a gate contact, the gate contact being between the source region and the drain region; and
   first and second ohmic contacts on the source and drain regions, respectively, that respectively define a source contact and a drain contact, the source contact and the drain contact having respective first and second widths, wherein the first width and the second width are different and wherein the source contact and the source region are split into first and second portions such that a portion of a surface of a first epitaxial layer is not disposed beneath the source contact or the source region or the drain contact and the drain region are split into first and second portions such that a portion of the surface of the first epitaxial layer is not disposed beneath the drain contact or the drain region.

2. The unit cell of claim 1, wherein the source region and the drain region have respective third and fourth widths and wherein the third and fourth widths are different.

3. A unit cell of a high power transistor comprising:
   a transistor having a source region, a drain region and a gate contact, the gate contact being between the source region and the drain region; and first and second ohmic contacts on the source and drain regions, respectively, that respectively define a source contact and a drain contact, the source contact and the drain contact having respective first and second widths, wherein the first width and the second width are different and wherein the source contact is split into at least first and second portions such that a portion of a surface of the source region is not disposed beneath the source contact.

4. A unit cell of a high power transistor comprising:

a transistor having a source region, a drain region and a gate contact, the gate contact being between the source region and the drain region; and first and second ohmic contacts on the source and drain regions, respectively, that respectively define a source contact and a drain contact, the source contact and the drain contact having respective first and second widths, wherein the first width and the second width are different and wherein the drain contact is split into at least first and second portions such that a portion of a surface of the drain region is not disposed beneath the drain contact.

5. The unit cell of claim 4, wherein the transistor comprises a metal semiconductor field effect transistor (MESFET).

6. The unit cell of claim 5, wherein the MESFET comprises a silicon carbide (SiC) MESFET or a gallium Nitride (GaN) HEMT.

7. A unit cell of a high power transistor comprising:

a transistor having a source region, a drain region and a gate contact, the gate contact being between the source region and the drain region; and first and second ohmic contacts on the source and drain regions, respectively, that respectively define a source contact and a drain contact, wherein the source contact is split into first and second portions such that a portion of a surface of a first epitaxial layer is not disposed beneath the source contact or wherein the drain contact is split into first and second portions such that a portion of the surface of the first epitaxial layer is not disposed beneath the drain contact.

8. The unit cell of claim 7, wherein the source contact is split into at least first and second portions such that a portion of a surface of the source region is not disposed beneath the source contact or wherein the drain contact is split into at least first and second portions such that a portion of a surface of the drain region is not disposed beneath the drain contact.

9. The unit cell of claim 7, wherein the source contact is split, wherein the source and drain contacts have respective first and second widths, wherein the first width is less than an average of the first and second widths and wherein the second width is greater than the average of the first and second widths.

10. The unit cell of claim 7, wherein the source contact is split, wherein the source and drain contacts have respective first and second widths, wherein the first width is greater than an average of the first and second widths and wherein the second width is less than the average of the first and second widths.

11. The unit cell of claim 7, wherein the source contact is split, wherein the source and drain contacts have respective first and second widths, wherein the first and second widths are equal.

12. The unit cell of claim 7, wherein the drain contact is split, wherein the source and drain contacts have respective first and second widths, wherein the first width is less than an average of the first and second widths and wherein the second width is greater than the average of the first and second widths.

13. The unit cell of claim 7, wherein the drain contact is split, wherein the source and drain contacts have respective first and second widths, wherein the first width is greater than an average of the first and second widths and wherein the second width is less than the average of the first and second widths.

14. The unit cell of claim 7, wherein the drain contact is split, wherein the source and drain contacts have respective first and second widths, wherein the first and second widths are equal.

15. The unit cell of claim 7, wherein the transistor comprises a metal semiconductor field effect transistor (MESFET).

16. The unit cell of claim 15, wherein the MESFET comprises a silicon carbide (SiC) MESFET, a gallium arsenide (GaAs) MESFET or a gallium Nitride (GaN) HEMT.

17. A high power transistor comprising:

a plurality of unit cells each having a source region and a drain region;

a plurality of gate electrodes of the unit cells, ones of the plurality of gate electrodes being between the source region and the drain region of the unit cells;

a plurality of source electrodes on the source regions of the unit cells; and a plurality of drain electrodes on the drain regions of the unit cells, wherein the plurality of source electrodes are split into at least first and second portions such that a portion of a surface of a first epitaxial layer is not disposed beneath the source electrodes or wherein the plurality of drain contacts and the plurality of drain regions are split into at least first and second portions such that a portion of the surface of the first epitaxial layer is not disposed beneath the source electrodes.

18. A method of forming a unit cell of a high power transistor comprising:

forming a transistor having a source region, a drain region and a gate contact, the gate contact being between the source region and the drain region; and forming first and second ohmic contacts on the source and drain regions, respectively, that respectively define a source contact and a drain contact, the source contact and the drain contact having respective first and second widths, wherein the first and second widths are different and wherein the first width is narrower than the second width, wherein the first width is from about 10 to about 20 µm and wherein the second width is from about 25 to about 35 µm.

19. A method of forming a unit cell of a high power transistor comprising:

forming a transistor having a source region, a drain region and a gate contact, the gate contact being between the source region and the drain region; and forming first and second ohmic contacts on the source and drain regions, respectively, that respectively define a source contact and a drain contact, the source contact and the drain contact having respective first and second widths, wherein the first and second widths are different and wherein the second width is narrower than the first width, wherein the second width is from about 10 to about 15 µm and wherein the first width is from about 25 to about 35 µm.

20. The method of claim 19, wherein the source region and the drain region have respective third and fourth widths and wherein the third and fourth widths are different.

21. A method of forming a unit cell of a high power transistor comprising:
forming a transistor having a source region, a drain region and a gate contact, the gate contact being between the source region and the drain region; and
forming first and second ohmic contacts on the source and drain regions, respectively, that respectively define a source contact and a drain contact, the source contact and the drain contact having respective first and second widths, wherein the first and second widths are different and wherein the source contact and the source region are split into first and second portions such that a portion of a surface of a first epitaxial layer is not disposed beneath the source contact or the source region or the drain contact and the drain region are split into first and second portions such that a portion of the surface of the first epitaxial layer is not disposed beneath the drain contact or the drain region.

22. A method of forming a unit cell of a high power transistor comprising:
forming a transistor having a source region, a drain region and a gate contact, the gate contact being between the source region and the drain region; and
forming first and second ohmic contacts on the source and drain regions, respectively, that respectively define a source contact and a drain contact, the source contact and the drain contact having respective first and second widths, wherein the first and second widths are different and wherein the source contact is split into at least first and second portions such that a portion of a surface of the source region is not disposed beneath the source contact.

23. A method of forming a unit cell of a high power transistor comprising:
forming a transistor having a source region, a drain region and a gate contact, the gate contact being between the source region and the drain region; and
forming first and second ohmic contacts on the source and drain regions, respectively, that respectively define a source contact and a drain contact, the source contact and the drain contact having respective first and second widths, wherein the first and second widths are different and wherein the drain contact is split into at least first and second portions such that a portion of a surface of the drain region is not disposed beneath the drain contact.

24. The method of claim 23, wherein forming the transistor comprises forming a metal semiconductor field effect transistor (MESFET).

25. The method of claim 24, wherein forming the MESFET comprises forming a silicon carbide (SiC) MESFET or a gallium Nitride (GaN) HEMT.

26. A method of forming a unit cell of a high power transistor comprising:
forming a transistor having a source region, a drain region and a gate contact, the gate contact being between the source region and the drain region; and
forming first and second ohmic contacts on the source and drain regions, respectively, that respectively define a source contact and a drain contact, wherein the source contact is split into at least first and second portions such that a portion of a surface of a first epitaxial layer is not disposed beneath the source contact or wherein the drain contact is split into at least first and second portions such that a portion of the surface of the first epitaxial layer is not disposed beneath the drain contact.

27. The method of claim 26, wherein the source contact is split into at least first and second portions such that a portion of a surface of the source region is not disposed beneath the source contact or wherein the drain contact is split into at least first and second portions such that a portion of a surface of the drain region is not disposed beneath the drain contact.

28. The method of claim 26, wherein the source contact is split, wherein the source and drain contacts have respective first and second widths, wherein the first width is less than an average of the first and second widths and wherein the second width is greater than the average of the first and second widths.

29. The method of claim 26, wherein the source contact is split, wherein the source and drain contacts have respective first and second widths, wherein the first width is greater than an average of the first and second widths and wherein the second width is less than the average of the first and second widths.

30. The method of claim 26, wherein the source contact is split, wherein the source and drain contacts have respective first and second widths, wherein the first and second widths are equal.

31. The method of claim 26, wherein the drain contact is split, wherein the source and drain contacts have respective first and second widths, wherein the first width is less than an average of the first and second widths and wherein the second width is greater than the average of the first and second widths.

32. The method of claim 26, wherein the drain contact is split, wherein the source and drain contacts have respective first and second widths, wherein the first width is greater than an average of the first and second widths and wherein the second width is less than the average of the first and second widths.

33. The method of claim 26, wherein the drain contact is split, wherein the source and drain contacts have respective first and second widths, wherein the first and second widths are equal.

34. The method of claim 26, wherein forming the transistor comprises forming a metal semiconductor field effect transistor (MESFET).

35. The method of claim 34, wherein forming the MESFET comprises forming a silicon carbide (SiC) MESFET, a gallium arsenide (GaAs) MESFET or a gallium Nitride (GaN) HEMT.

36. A method of forming a high power transistor comprising:
forming a plurality of unit cells each having a source region and a drain region;
forming a plurality of gate electrodes of the unit cells, ones of the plurality of gate electrodes being between the source region and the drain region of the unit cells;
forming a plurality of source electrodes on the source regions of the unit cells; and
forming a plurality of drain electrodes on the drain regions of the unit cells, wherein the plurality of source electrodes are split into at least first and second portions such that a portion of a surface of a first epitaxial layer is not disposed beneath the source electrodes or wherein the plurality of drain contacts are split into at least first and second portions such that a portion of the surface of the first epitaxial layer is not disposed beneath the drain electrodes.

* * * * *